United States Patent
Koenenkamp

(10) Patent No.: US 7,403,584 B2
(45) Date of Patent: Jul. 22, 2008

(54) PROGRAMMABLE PHASE INTERPOLATOR ADJUSTMENT FOR IDEAL DATA EYE SAMPLING

(75) Inventor: Ingo Koenenkamp, Braunschweig (DE)

(73) Assignee: Intel Corporation, Santa Clara, CA (US)

( * ) Notice: Subject to any disclaimer, the term of this patent is extended or adjusted under 35 U.S.C. 154(b) by 814 days.

(21) Appl. No.: 10/748,236

(22) Filed: Dec. 31, 2003

(65) Prior Publication Data

US 2005/0147194 A1      Jul. 7, 2005

(51) Int. Cl.
    *H04L 7/00*       (2006.01)
(52) U.S. Cl. .................................. 375/371; 375/354
(58) Field of Classification Search ................ 375/371, 375/354

See application file for complete search history.

(56) References Cited

U.S. PATENT DOCUMENTS

| | | | | |
|---|---|---|---|---|
| 4,821,296 A | * | 4/1989 | Cordell | 375/374 |
| 5,602,879 A | * | 2/1997 | Wada | 375/355 |
| 5,612,975 A | * | 3/1997 | Becker et al. | 375/319 |
| 5,878,088 A | * | 3/1999 | Knutson et al. | 375/324 |
| 6,801,066 B2 | * | 10/2004 | Lee | 327/119 |
| 2002/0163981 A1 | * | 11/2002 | Troemel, Jr. | 375/345 |
| 2004/0037366 A1 | * | 2/2004 | Crawford | 375/295 |

* cited by examiner

*Primary Examiner*—Mohammed Ghayour
*Assistant Examiner*—Juan Alberto Torres
(74) *Attorney, Agent, or Firm*—Ked & Associates, LLP

(57) ABSTRACT

A clock recovery circuit includes a demodulator which generates in-phase and quadrature signals from a data signal and a phase adjuster which adjusts a phase of the quadrature signal independently from a phase of the in-phase clock signal. The phase adjustment causes a non-orthogonal relationship to exist between the phases of the quadrature and in-phase signals. The independent phase adjustment may be dynamically performed or may be performed in fixed increments to achieve a predetermined level of performance. In one application, the adjusted quadrature phase signal serves as a clock signal for controlling sampling of the data signal.

24 Claims, 12 Drawing Sheets

US 7,403,584 B2

PROGRAMMABLE PHASE INTERPOLATOR ADJUSTMENT FOR IDEAL DATA EYE SAMPLING

FIELD

This invention generally relates to phase-shifting circuits and their applications.

BACKGROUND OF THE INVENTION

High-speed signaling systems often transmit data without a dedicated clock. Digital receivers must therefore have a reference clock or recover the clock from the data itself. This timing information is used to control a variety of functions in the receiver including the sampling process used to convert received data into digital signals.

A variety of recovery circuits have been proposed for extracting clock information from received data. A variety of supplied methods for the reference clock also exists. In general, due to issues with spectral purity, the reference clock will be provided at a lower rate and multiplied in frequency with an internal clock multiplication circuitry. These circuits often use an interpolator to set the phase of the recovered clock during sampling. From a performance standpoint, the location of the clock phase relative to an eye diagram generated for the data is a relevant consideration.

Eye diagrams are usually generated to determine the modulation characteristics of received data signals. The shape of an eye diagram changes depending on a number of receiver-related factors including noise margin, tolerances for timing and amplitude variations, and others generally, the width of the eye determines the timing margin and the widths of the eye transition points determine jitter. Also, a direct correlation exists between eye shape and the type of logic used to construct the receiver circuits. For example, current mode logic has a tendency to produce an irregularly shaped eye, whereas other logic types produce eyes with greater symmetry.

In order to recover clock phase information in a receiver, the incoming data is usually demodulated into in-phase and quadrature signals. The phase of the in-phase signal is then shifted to coincide with a crossing point in the eye diagram. Because the in-phase and quadrature signals are maintained in an orthogonal relationship, shifting the phase of the in-phase signal will necessarily re-position the quadrature signal phase 90E from the crossing point in the eye diagram. The position of the quadrature signal phase has a direct influence on the bit-error rate of the receiver. If this position is not optimum, bit-error rates will increase, which, in turn, will cause errors to be induced during the data sampling process.

DETAILED DESCRIPTION

A clock signal recovery circuit in accordance with. a first embodiment of the present invention may be used to generate clock phase information for controlling the sampling of data. The data may be received or otherwise conveyed in any one of a variety of communications or high-speed signaling systems, including but not limited to optical, wireless, and wireline systems. If the data received in these systems are not transmitted with a dedicated clock signal, the clock signal recovery circuit may be used to recover clock information from the received data using known techniques. The clock information is then used as a basis for converting the data into digital signals through sampling. In an alternative embodiment, the clock information is recovered from a master clock.

Figure 1:
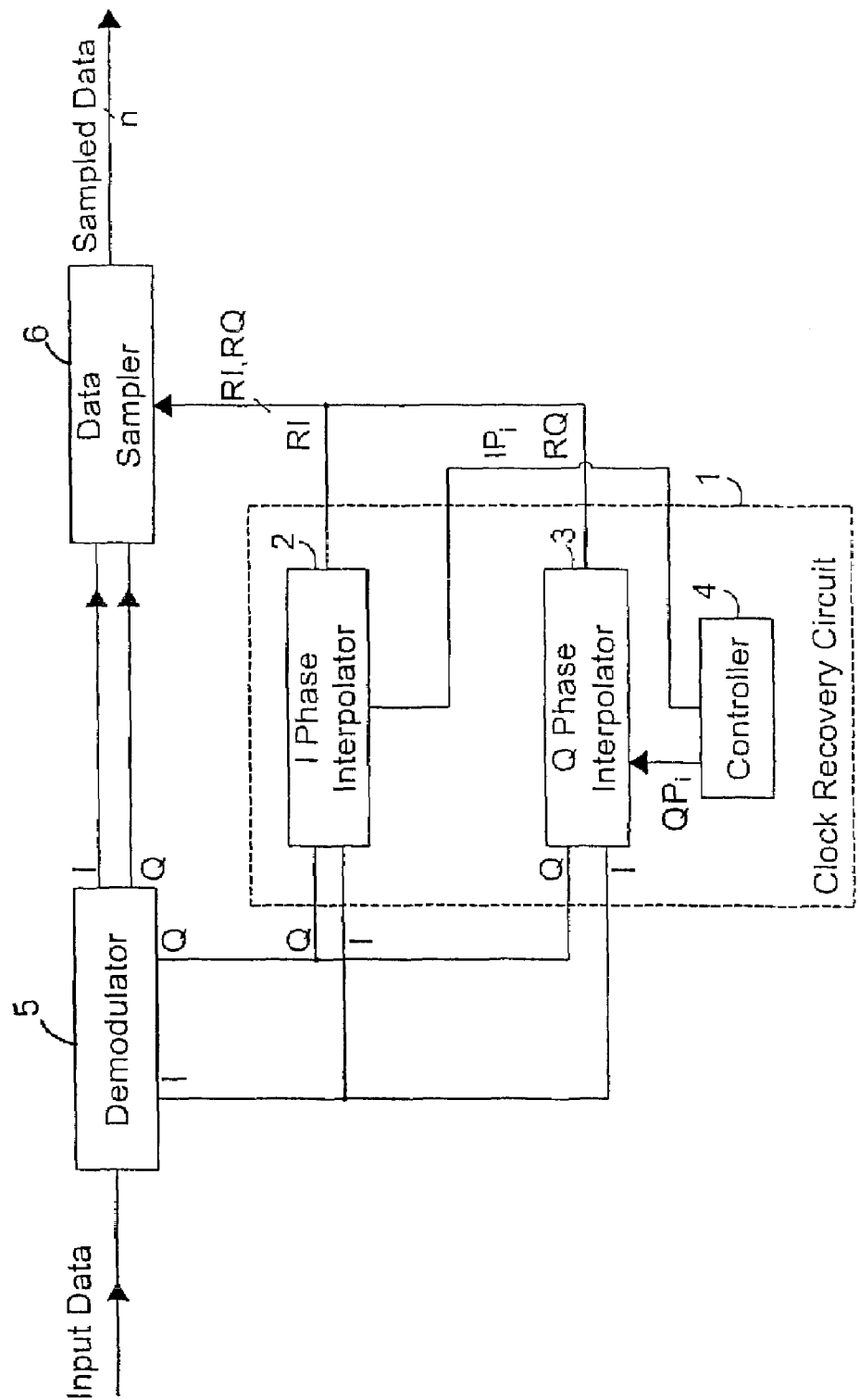
FIG. 1 is a diagram showing a clock recovery circuit that generates phase information for controlling data sampling in accordance with a first embodiment of the present invention.

Referring to FIG. 1, the clock signal recovery circuit 1 includes a pair of phase interpolators 2 and 3 which respectively shift phases of quadrature (Q) and in-phase (I) signals based on control information ($IP_i$, $QP_i$) generated by controller 4. The quadrature and in-phase signals may be generated using known techniques. For illustrative purposes, the signals are shown as being generated by a demodulator 5 which, for example, may be incorporated within a receiver configured to receive signals which conform to any communications or signaling protocol. The clock phase information generated by the interpolators (at least one of RI and RQ) is input into sampler 6 for controlling sampling of the demodulated data.

The phase interpolators are independently controlled to generate the clock phase information. This is accomplished by setting the control information from controller 4 to different values in order to achieve a predetermined output or level of performance. In one preferred application, the control information is set to different values in order to minimize the bit-error rate (BER) during sampling of the received data. This may be accomplished by comparing the phases of the I and Q signals before interpolation to an eye diagram.

An eye diagram is used to determine characteristics (e.g., pulse shaping, channel distortion) of modulated signals. In digital communication systems, eye diagrams provide an indication of how waveforms used to send multiple bits of data can potentially lead to intersymbol interference and other channel-related errors. Techniques for generating eye diagrams are known and generally involve plotting the signal against time on a fixed-interval time axis. At the end of the fixed interval, the signal is wrapped around to the beginning of the time axis. The diagram thus consists of multiple overlapping curves, and an intermediate area between the curves is referred to as the "eye." Eye diagrams may be separately generated for the in-phase and quadrature components of the signal.

The in-phase and quadrature signals may be mapped to the eye diagram based on their respective phases. If the phases are not optimally matched to the eye diagram, the bit-error rate that occurs during data sampling will be higher than optimally desired. This will have an adverse affect on data recovery accuracy, signal-to-noise ratio, and accordingly the overall performance of the receiver. The controller may perform this mapping function using known techniques (e.g., Fourier transform) or another processing element may be used for this purpose. The mapping function may be internally performed by generating a mathematical representation of the eye diagram and then relating the phases of the I and Q signals to this representation. A visual representation of the eye diagram may be displayed on an oscilloscope or computer monitor.

Once the phases of the in-phase and quadrature signals are mapped to the eye diagram, the controller adjusts the configuration values of at least one of the interpolators to achieve a predetermined level of performance. If the quadrature phase signal is used to control data sampling, the phase of the Q signal is independently adjusted relative to the phase of the I signal. This is achieved by controller 4 setting the phase interpolators to different configuration values that control the phases of the I and Q signals, i.e., the RI and RQ phases input into the data sampler. Examples of these configuration values are discussed below.

In order to optimize BER performance, the phases of both the in-phase and quadrature signals are adjusted so that they map to predetermined positions on the eye diagram. According to one approach, the configuration values of interpolator 2 are set to map the in-phase signal to a crossing in the eye diagram. Because the in-phase and quadrature signals are generated to have an orthogonal phase relationship, mapping the in-phase signal to an eye crossing will necessarily shift the position of the quadrature signal phase 90 degrees from this crossing.

If the quadrature signal phase controls data sampling, the shifted location of the Q signal phase may not be considered optimal for purposes of minimizing BER. More specifically, the widest part of the eye diagram is considered the ideal point for sampling data with the lowest BER. Shifting the phase of the in-phase signal to coincide with the eye crossing may not necessarily cause the quadrature signal phase to map to the widest part of the eye. In accordance with this embodiment, the controller may independently adjust the configuration values of interpolator 3 to further shift the phase of the quadrature signal phase to coincide with the widest point in the eye diagram. This additional shift will cause the difference in phase between the in-phase and quadrature signals to deviate from their previous orthogonal relationship, i.e., the difference in phase between RI and RQ is no longer 90E.

In order to independently shift the quadrature signal phase RQ to a position that coincides with the widest point on the eye diagram or any other point, that point must first be located. This may be accomplished using any one of a variety of techniques. For example, one method (called the static method) may be used to set the RQ phase manually. This method includes inputting test signals into the circuit during device validation and then performing an internal analyzer function (e.g., a PRBS analyzer) to determine the BER. These measurements can be performed for different corners/skews and for all combinations of the independently shifted RQ phase position. Depending on the results, the shifted RQ phase can then be programmed to an appropriate value during setup of the device.

Another method (called the dynamic method) adjusts the RQ phase dynamically. In this method, the data stream (e.g., a SONET frame including B0 and B1 information) is analyzed either arbitrarily or at a predetermined time. The RQ phase is then dynamically adjusted to an offset point during this operation. Any kind of data analyzer may be used to perform the data stream analysis.

Once the widest point is determined, the controller inputs values into phase interpolator 3 to independently shift the quadrature signal phase in a way which reduces the difference between this phase and the phase corresponding to the widest point. Preferably, the quadrature signal phase is dynamically shifted to reduce the difference to zero.

Alternatively, the controller may be programmed to independently shift RQ in predetermined offsets or phase increments. In this case, the phase of the quadrature signal may not exactly correspond to the widest point on the eye diagram, but the difference between RQ and the phase of the widest point would be substantially minimized to thereby generate a much improved BER.

According to another approach, the controller may adjust the configuration values of interpolator 3, without any adjustment to interpolator 2. This situation may arise, for example, when the phase of the in-phase signal as output from the demodulator is already coincident with a crossing in the eye diagram, or when RI is otherwise acceptable for achieving a predetermined level of performance for data sampling.

According to another approach, the controller may adjust the configuration values of both phase interpolators to independently shift RI and RQ to positions other than eye crossing and widest point, under conditions where the phase difference between RI and RQ is no longer orthogonal.

Figure 2:
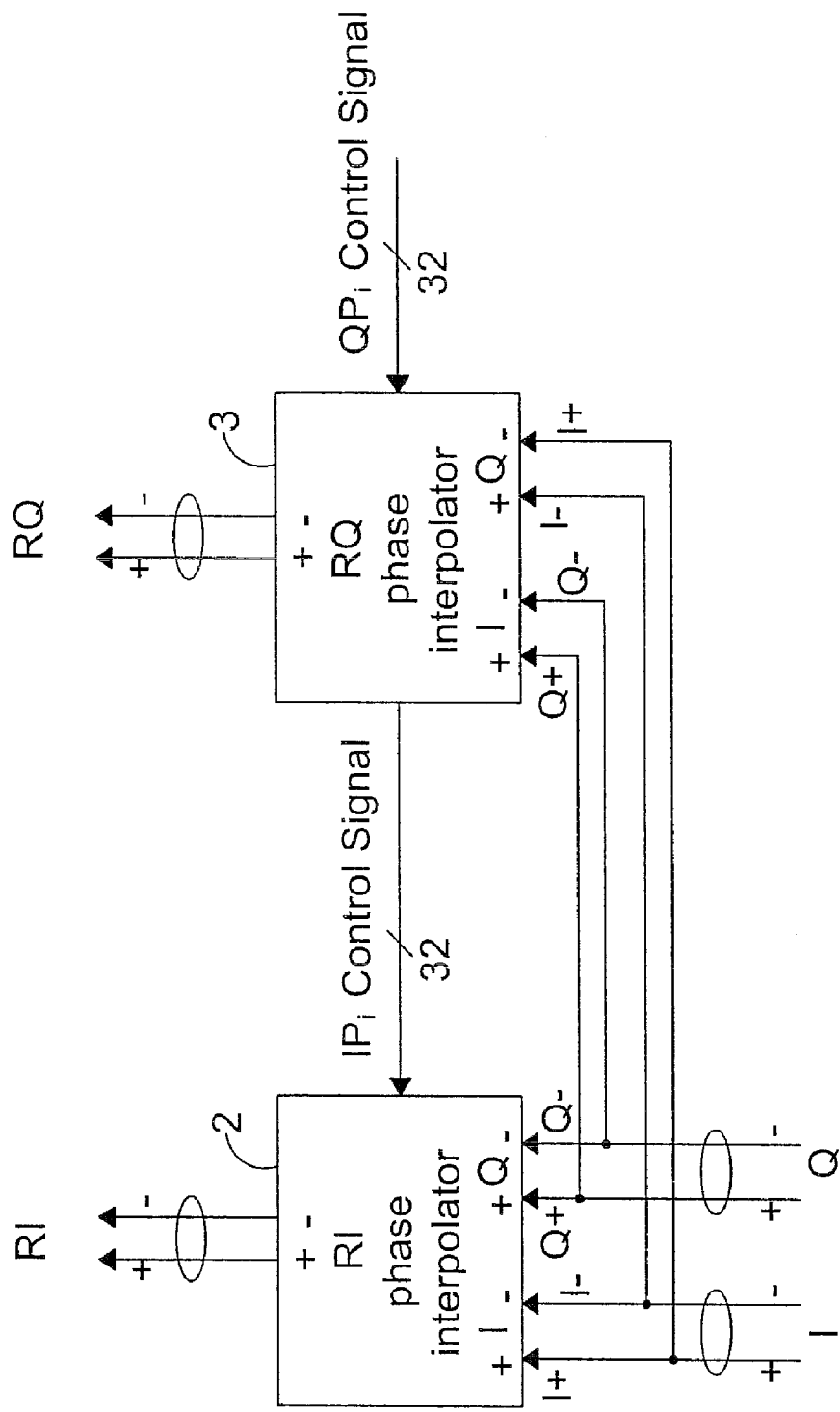
FIG. 2 is a diagram showing phase interpolators used in the clock recovery circuit of FIG. 1.

FIG. 2 shows an example of how the interpolators may be implemented to generate phase signals from differential in-phase and quadrature inputs. The I phase interpolator is shown as receiving differential I$^\pm$ and Q$^\pm$ signals from which the I signal phase RI is generated based on control information IP$_i$ generated from controller 4. The Q phase interpolator is shown as receiving the same differential I$^\pm$ and Q$^\pm$ signals from which the Q signal phase RQ is generated based on control information QP$_i$ generated from controller 4. In accordance with the present embodiment, the value of QP$_i$ is independently adjusted to cause the RQ phase to match a predetermined point on the eye diagram, which is preferably the ideal sampling point. An example of this circuit is discussed in greater detail below, where the control information into the interpolators are provided as 32-bit information.

The data sampler samples the signals output from the demodulator based on the signals output from one or more of the phase interpolators. The outputs of these interpolators therefore serve as clock signals for controlling the sampling process. More specifically, the four clock phases output from the interpolators are used to sample the data at four different positions. For digital circuitry, the resulting four samples may be synchronized to one single clock domain. This is a timing critical task. As an example, the RI+ clock phase may be chosen as the clock the data is synchronized to. A detailed explanation of how sampling may be performed is provided below.

Figure 3:
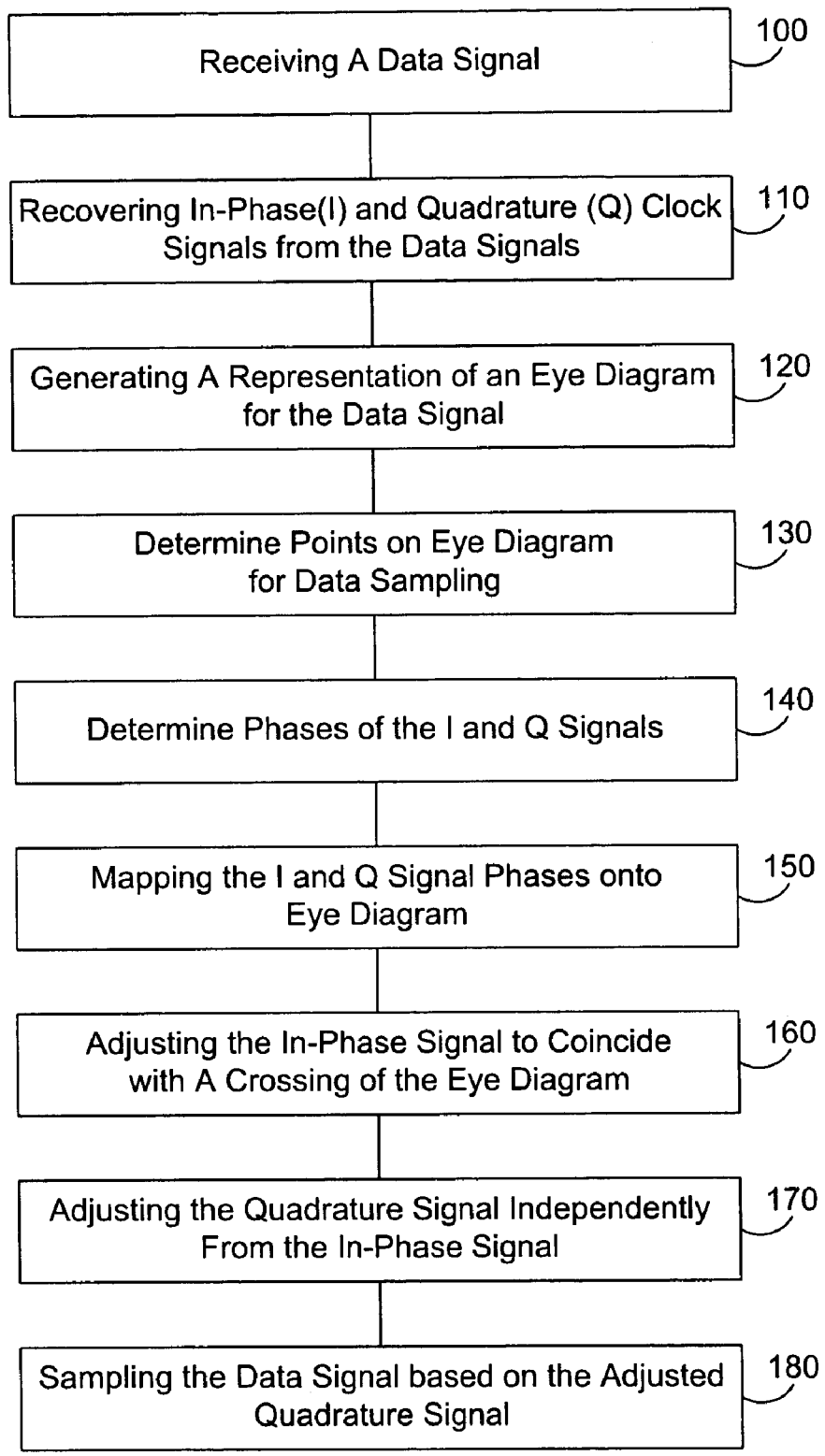
FIG. 3 is a diagram showing functional blocks included in a method that generates phase information for controlling data sampling in accordance with one embodiment of the present invention.

FIG. 3 shows functional blocks included in a method for sampling data in accordance with one embodiment of the present invention. The method is preferably performed using the clock recovery and data sampling circuits previously described, however other circuits of this type may be used.

An initial block includes receiving a data signal to be sampled. (Block 100). The data signal may be one transmitted in a high-speed signaling system, a communication system, or any other system designed to transmit, receive, or otherwise carry data signals. The signals may be optical signals including but not limited to those in a synchronous optical network (SONET), wireless signals which conform to any one of a number of communications standards (e.g., CDMA, GSM, IMT-2000), as well as wireline signals.

Once received, the data signal is demodulated into in-phase (I) and quadrature (Q) signals using known techniques. (Block 110). An example of this demodulation is discussed below in connection with a specific application of the clock recovery and data sampling system. The demodulation may be performed to generate differential I and Q signals as previously indicated.

The in-phase and quadrature signals are used to generate a representation of an eye diagram for the input data signal. (Block 120). This representation may be a mathematical expression of the diagram in electronic signal form which may or may not be displayed on an oscilloscope for viewing. Once the eye diagram is formed, it is analyzed to determine the locations of one or more predetermined points to be used for controlling data sampling. (Block 130). In order to minimize BER, these points preferably include a crossing point and the widest point in the eye.

Figure 4:
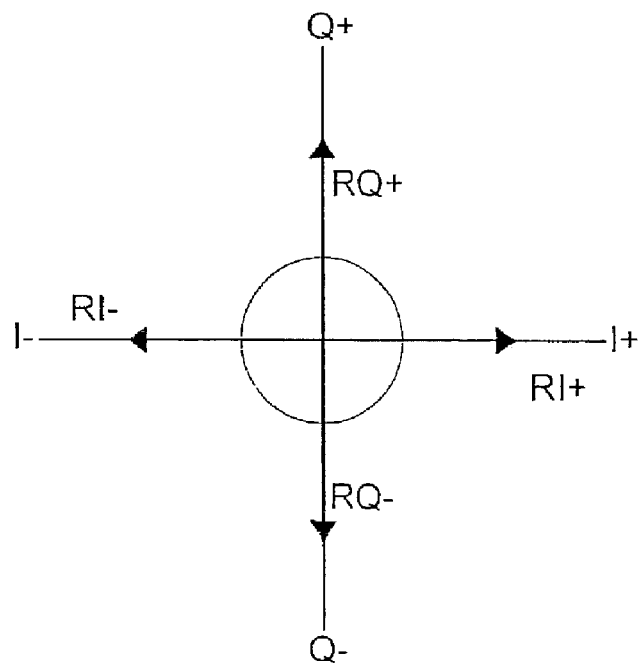
FIG. 4 is a diagram showing phases of received data signals that have been demodulated.

Next, the phases of the in-phase and quadrature signals are determined. (Block 140). FIG. 4 shows an example of how differential forms of the in-phase and quadrature signals may be plotted on a four-phase clock diagram. In this diagram, differential in-phase components are referenced along the horizontal axis and differential quadrature phase components are referenced along the vertical axis. The phases of the differential in-phase and quadrature signals $RI^+$, $RI^-$, $RQ^+$, and $RQ^-$ as demodulated are shown for illustrative purposes as residing along the axes. (Because the demodulation is performed using, for example, 90 degree-shifted versions of a local oscillator, $RI^{\pm}$ are orthogonal to $RQ^{\pm}$ respectively. Also, $RI^+$ and $RI^-$ differ in phase by 180° and the same is true for $RQ^+$ and $RQ^-$.)

Figure 5:
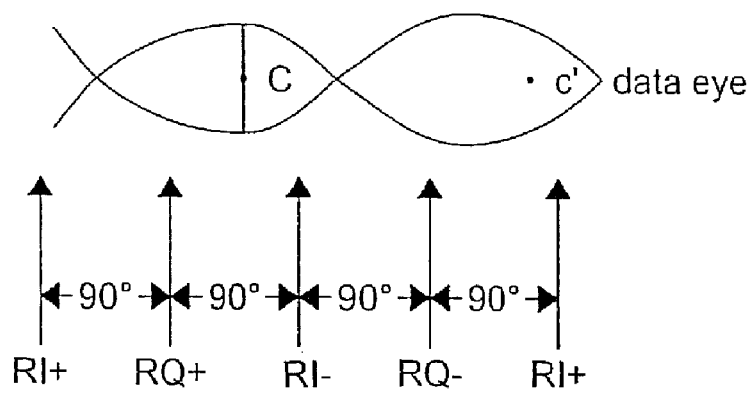
FIG. 5 is a diagram showing a mapping of phases of the demodulated signals on an eye waveform generated for the data to be sampled.

The demodulated phases of the in-phase and quadrature signals maybe mapped or otherwise related to the representation of the eye diagram; that is, the mapping may be mathematically performed using known techniques and the results of this mapping may optionally be displayed in viewable form on an oscilloscope. (Block 150). FIG. 5 shows a mapping of the differential signal phases in FIG. 4 onto an eye diagram generated for the received data signal. This eye diagram is slightly asymmetric with respect to point C which corresponds to the widest point between the curves. A diagram of this type is typically generated when current mode logic (CML) for high-speed signaling. The method may, however, be applied to systems which transmit, receive, or otherwise convey signals using other types of logic and which therefore produce eye diagrams which are more or less symmetrical than the example shown.

From the eye diagram mapping, it is evident that none of the phases of the in-phase and quadrature signals corresponds to the center point. This may be considered undesirable for many applications including those used to perform high-speed signaling and communications. For these applications, the quadrature signal phase $RQ^+$ should be coincident with the center point of the eye in order to achieve the most favorable (e.g., lowest) BER. For this reason, center point C is often referred to as the ideal sampling point.

In order to improve BER, the phases of at least one of the in-phase and quadrature signals are independently shifted so that at least one of these phases is coincident with the ideal sampling point in the eye diagram. This may be achieved in a number of ways.

Figure 6:
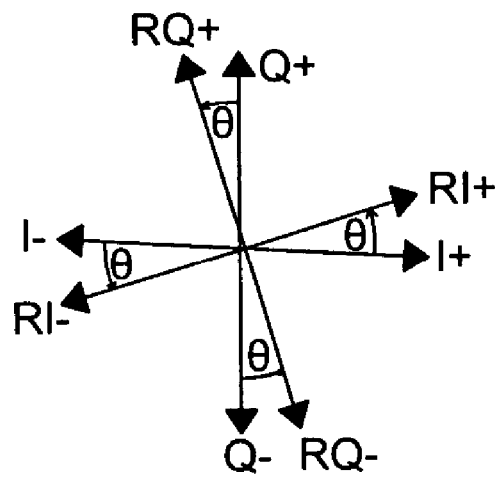
FIG. 6 is a diagram showing a first shifting of the phase signals in FIG. 6.

One way involves performing two phase shifts of the in-phase and quadrature signals. The first phase shift involves shifting the in-phase signal so that it coincides with a crossing of the eye diagram; that is, $RI^+$ coincides with crossing point X on the eye diagram. (Block 160). This may be accomplished, for example, by adjusting configuration values in interpolator 2. Adjusting the in-phase signal in this manner causes $RI^+$ to rotate by an angle θ as shown in FIG. 6. Because of the orthogonal relationship among the phase signals, the remaining differential phases $RI^-$, $RQ^+$, and $RQ^-$ shift by the same amount.

Figure 7:
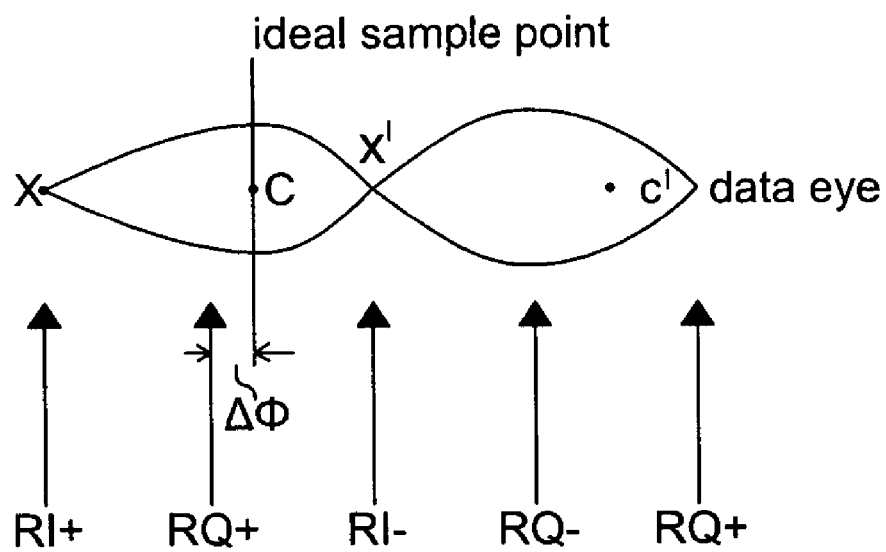
FIG. 7 is a diagram showing a mapping of the shifted phases in FIG. 8 on the eye waveform.

FIG. 7 shows a mapping of the phase signals onto the eye diagram after the first shift. The shifted phase $RI^+$ now coincides with crossing point X and the same is true of $RI^-$ with respect to a succeeding crossing point. Consecutive phases are still separated by 90°. If after the first phase shift, the quadrature signal phase $RQ^+$ does not coincide with ideal sampling point C, then even though the in-phase differential signals are mapped to the crossing points an optimum BER will not be realized during sampling. To optimize BER, a second phase shift may then be performed.

The second phase shift involves shifting the differential quadrature signal phases independently from the in-phase signals subject to the first shift. (Block 170). This may be accomplished, for example, by adjusting one or more configuration values of interpolator 3, without effecting any change in the configuration values of interpolator 2.

The independent phase shift may be accomplished in a number of ways. For example, the phase difference between the $RQ^+$ mapping and ideal sampling point C (shown as Δφ in FIG. 9) may be determined. One or more configuration values may then be computed, for example, by controller 4, that will produce a shift in $RQ^+$ (and commensurately $RQ^-$) that reduces or completely eliminates the phase difference. These values may then be input into interpolator 3 to shift $RQ^+$ and $RQ^-$ by this amount.

Figure 9:
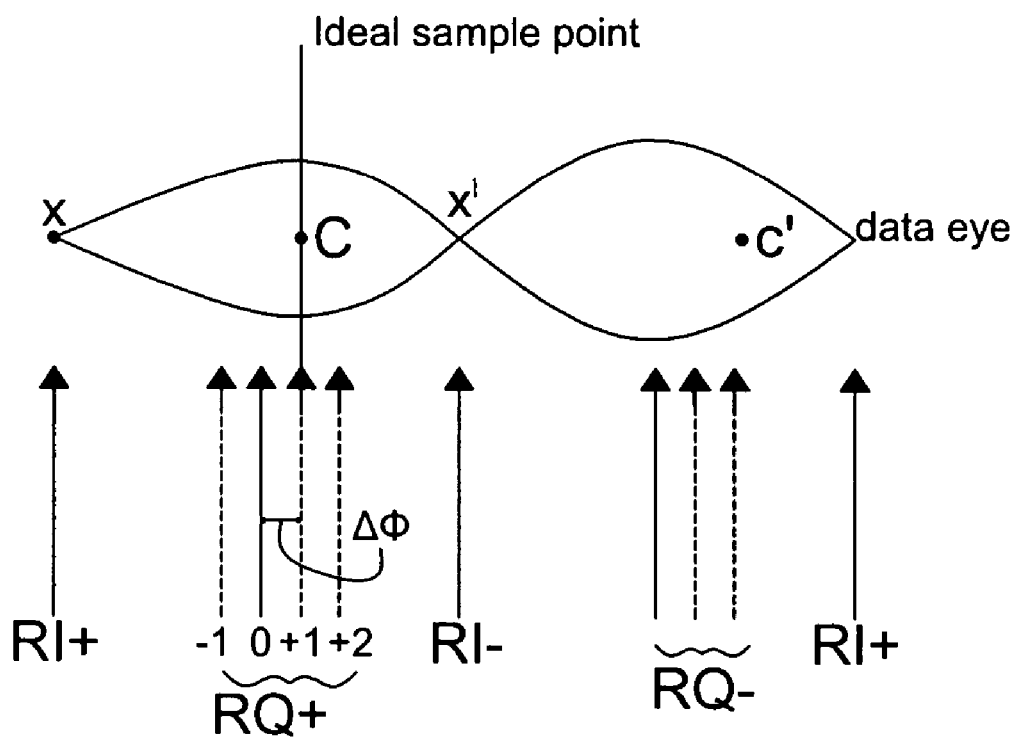
FIG. 9 is a diagram showing a mapping of the second shifting of the quadrature signal in FIG. 10.

As a result of this independent phase shift, an orthogonal relationship will no longer exists between $RQ^+$ and $RI^+$; that is, the difference in phase between $RQ^+$ and $RI^+$ (and between $RQ^-$ and $RI^-$) will not longer be 90E. Instead, this difference will be 90E" Δφ, depending upon the direction of the phase shift, e.g., the phase difference will be 90E+Δφ if as shown in FIG. 9 the first phase shift causes $RQ^+$ to be short (to the left of) of the ideal sampling point. The phase difference will be 90E−Δφ if the first phase shift causes $RQ^+$ to go past (to the right of) the ideal sampling point.

Because the second phase shift is independently performed, $RI^+$ remains at a position coincident with crossing point X and $RI^-$ remains at a position coincident with succeeding crossing point X'. Simultaneously, $RQ^+$ is shifted to a position which coincides with ideal sampling point C and $RQ^-$ is shifted to a position which coincides with C'. At these positions, the $RQ^+$ phase is able to optimally control data sampling in a way which minimizes BER.

Another approach for improving BER also involves independently shifting the phases one of the in-phase and quadrature signals. In this approach, all the phases are shifted by equal amounts until $RI^+$ coincides with crossing point X (and $RI^-$ coincides with crossing point X'). However, unlike in the previous approach, $RQ^+$ is independently shifted by interpolator 3 in one or more predetermined offsets or phase increments. This may be accomplished, for example, by adjusting the configuration values of interpolator 3 to preset values based on the difference between $RQ^+$ and sampling point C prior to the second shift. That is, once the phase difference "Δφ is determined, controller 4 sets one or more configuration values of interpolator 3 to present values. If the phase difference Δφ is divisible by one or more of the phase increments, then $RQ^+$ may be shifted one or more increments to reduce the phase difference.

Figure 8:
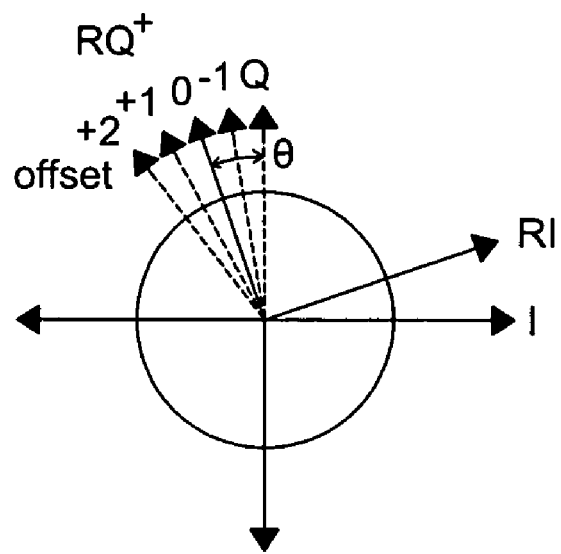
FIG. 8 is a diagram showing a second shifting of the quadrature signal phase in FIG. 8 which is independently performed relative to the in-phase signal.

FIG. 8 shows an example of how this incremental independent shifting of the quadrature signal phase may be performed. The $RQ^+$ phase that exists after the first shifting is performed (that is, after $RI^+$ is shifted to coincide with the crossing point) is denoted by position "0." FIG. 9 shows this position is mapped onto the eye diagram. After the phase difference Δφ is determined, the $RQ^+$ phase is then shifted one or more fixed phase increments independently from the $RI^+$ phase to reduce Δφ. Shifting by one phase increment causes $RQ^+$ to shift to the +1 position, which in this example exactly coincides with the ideal sampling point C shown in FIG. 9. Shifting by two increments causes $RQ^+$ to shift to position +2, which coincides with the overshifted position of the same number in FIG. 9. Shifting $RQ^+$ in the other direction by one increment shifts this phase to the −1 position as shown in both diagrams.

In the foregoing embodiments, $RQ^+$ is described as being shifted to a position near or coincident with the ideal sampling point only after $RI^+$ has been shifted to a position which coincides with a crossing point. One alternative approach involves shifting $RI^+$ to another point on the eye diagram which does not coincide with a crossing point, and then independently shifting $RQ^+$ either to a position which coincides with the ideal sampling point or a different point. Another alternative approach involves independently shifting $RQ^+$ to coincide with the sampling point or another point, without shifting $RI^+$ even once. Another approach involves performing a double shifting operation which results in shifting $RI^+$ and $RQ^+$ to points which respectively correspond to neither a crossing point nor an ideal sampling point on the eye diagram, where the second shift is performed for $RQ^+$ independently from $RI^+$. In this alternative embodiments, shifting $RQ^+$ and/or $RI^+$ to other values may not produce an optimal BER; however, these phase positions may prove to be beneficial for some other reason, i.e., to meet a level of performance desirable for some specific application.

After the in-phase and quadrature signal phases are shifted to predetermined positions, at least one of these signals is input as a clock signal for controlling the data sampler. (Block 180). Preferably, the differential forms of the quadrature phase signal is used for this purpose, however the in-phase signal may alternatively be used. The sampler samples the received data signal based on the timing information in the clock signal. This is accomplished by sampling the data signal with all four clock phases. All four sampled data bits (DRI+, DRQ+, DRI−, DRQ−) are then synchronized to one clock domain to allow digital processing of the edge detection circuitry.

Figure 10:
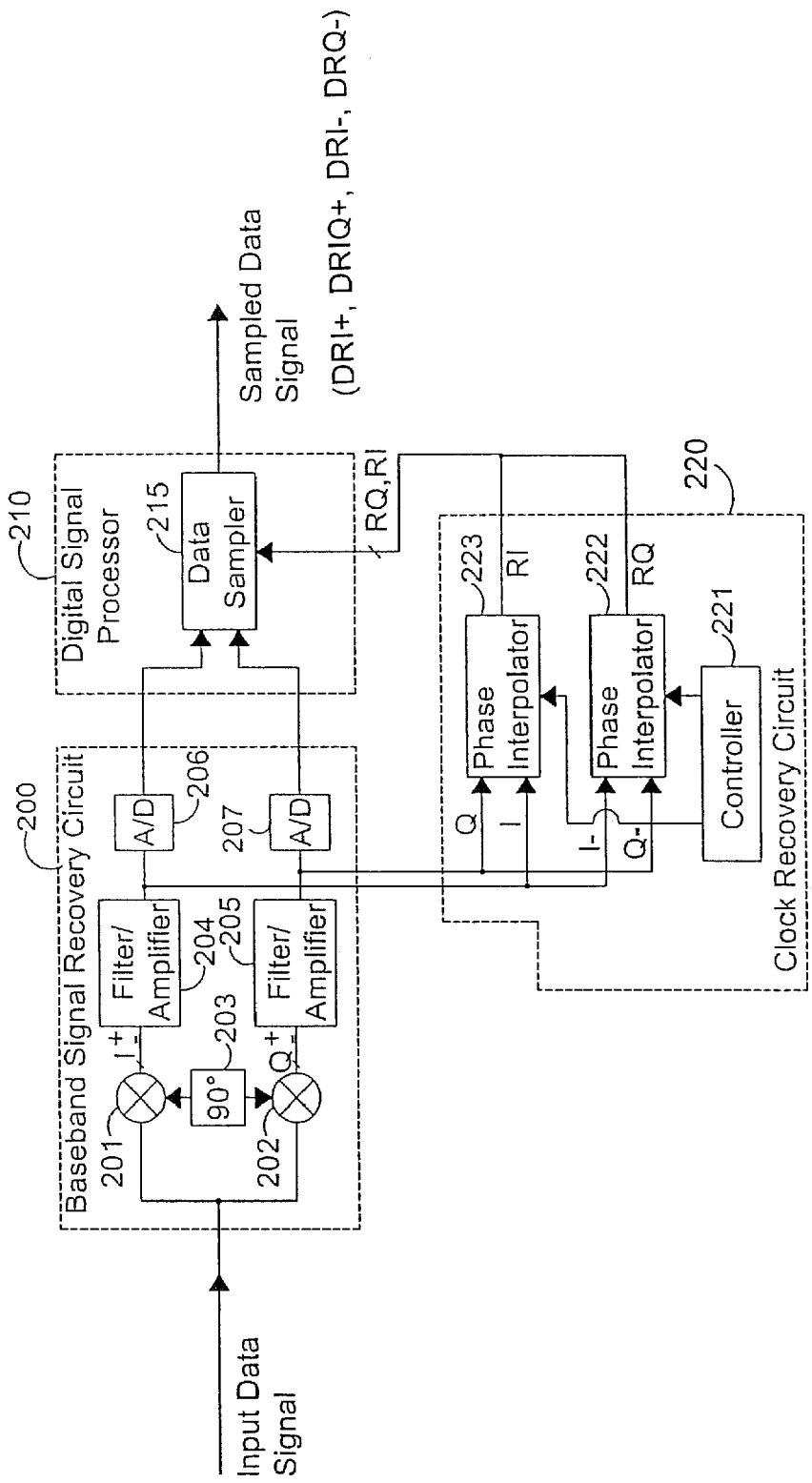
FIG. 10 is a diagram showing application of the clock recovery circuit in a communications receiver.

FIG. 10 shows an example of how the clock recovery circuit and its associated method may be applied for controlling data sampling in an RF communications receiver. The receiver includes a baseband signal recovery circuit 200, a digital signal processor 210, and a clock recovery circuit 220 in accordance with any of the embodiments previously described. The baseband recovery circuit includes a pair of mixers 201 and 202 for generating in-phase and quadrature signals from an input data signal based on frequencies from a local oscillator 203. In this exemplary arrangement, conversion to baseband is performed using only one down-conversion. Accordingly, the receiver may be said to have a direct-conversion architecture. If desired, however, the receiver may be configured to recover the baseband signal using superheterodyne or other conversion techniques. Once generated, the in-phase and quadrature signals are filtered and amplified in circuits 204 and 205, and then converted to digital signals in A/D converters 206 and 207.

Before A/D conversion the I and Q signals are input into the clock recovery circuit, which includes a controller 221 and a pair of phase interpolators 222 and 223. The interpolators generate clock phase signals RI and RQ from the in-phase and quadrature signals. The shifts in the phase signals are determined by configuration values set by the controller. To optimize BER, interpolator 223 may independently shift the phase of the quadrature signal so that the quadrature signal phase RQ coincides with an ideal sampling point on an eye diagram. At least one of the shifted phase signals are input into the digital signal processor, for controlling sampling of the baseband signal in sampler 215.

A recovery circuit in accordance with a second embodiment of the present invention may also be used to generate clock phase information for controlling the sampling of data. In this embodiment, however, the clock signal recovery circuit generates the clock phase information using a master clock instead of deriving the phase information from the received data. More specifically, the master clock generates I and Q reference signals, which are at a predetermined fraction and preferably half the frequency of the data rate. These signals may have any arbitrary phase with respect to the data and as such are not related in phase to the data. Phase interpolation is required to generate the recovered clock phases, RI and RQ. This clock information is then used as a basis for converting the data into digital signals through sampling.

Figure 11:
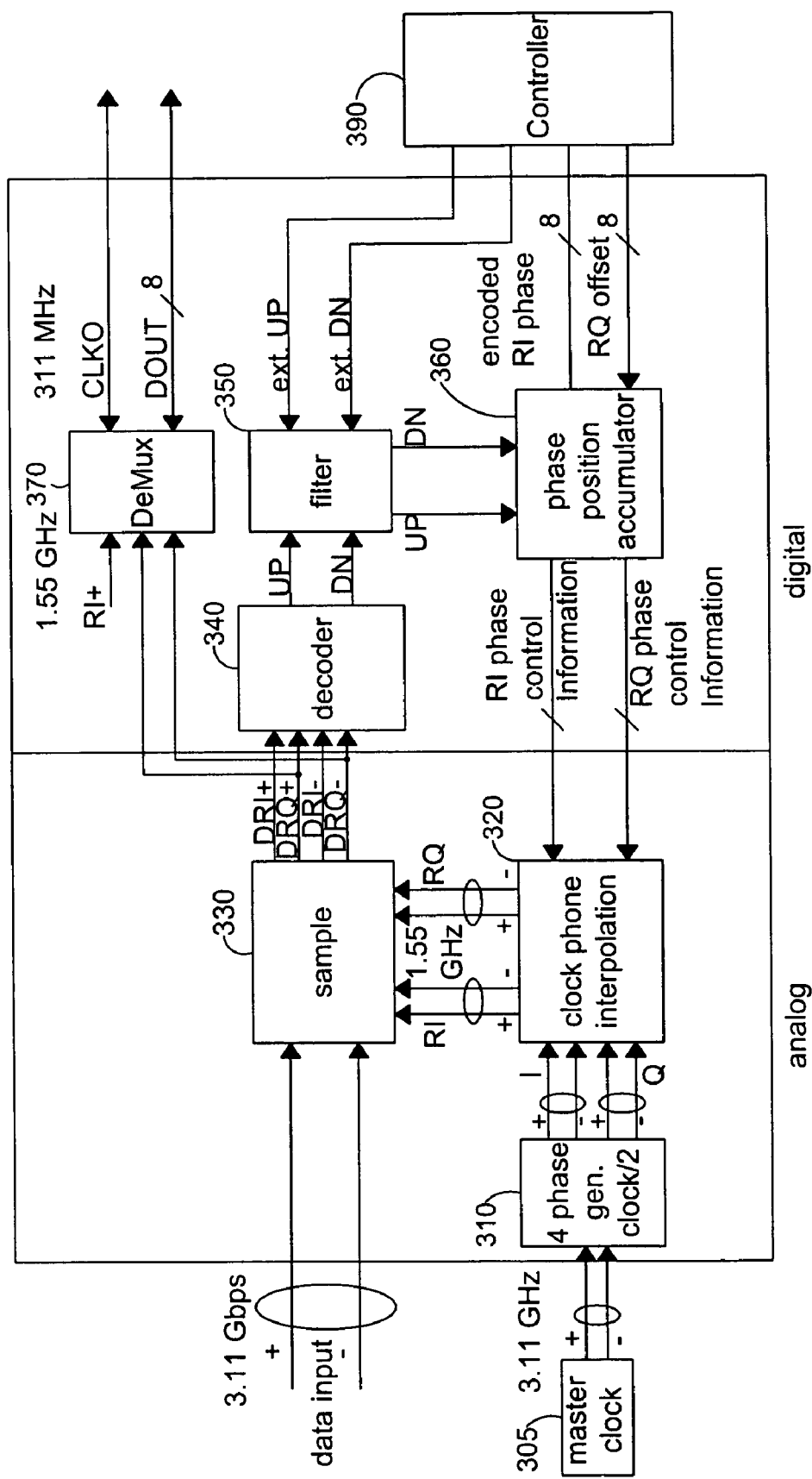
FIG. 11 is a diagram showing a recovery circuit in accordance with a second embodiment of the present invention.

FIG. 11 shows an example of the recovery circuit of the second embodiment. This circuit includes an analog section and a digital processing section. The analog section includes a 4-phase clock generator 310, a clock phase interpolator 320, and a data sampler 330. The digital processing section includes a decoder 340, a filter 350, and a phase position accumulator 360. A demultiplexer 370 is also included in the digital processing section for outputting clock and data signals.

In the analog section, the 4-phase clock generator generates I" and Q" signals from differential signals supplied from a master clock 305. More specifically, in the master clock, a reference clock signal is provided at low frequency but with good spectral purity. The reference clock signal is then multiplied to generate a high frequency using, for example, a phase-locked loop circuit. The resulting signal is input into the 4-phase clock generator, which generates the I" and Q" signals at a predetermined frequency. In one non-limiting example, the master clock signals are provided at twice the required frequency, e.g., the master clock maybe at 3.11 GHz and clock generator output maybe at 1.55 GHz. After performing a divide-by-2 operation, four clock phase signals I" and Q" are generated using known techniques with an accurate phase relation relative to one another.

The reference clock is preferably not in integer relation to the data rate. For example, the master clock frequency can differ by approximately 100 ppm from the data rate. A control loop in the digital processing section may control adjustment of the RI and RQ phases on a permanent basis, in which case the RI and RQ clock phases would rotate with respect to the I and Q clock phases. If the master clock is at the exact same frequency of the data rate, RI and RQ would basically be at fixed positions with respect to I and Q.

Once generated, the I" and Q" signals are input into the clock phase interpolator, which generates clock phases RI" and RQ" for controlling data sampling based on control information generated from the digital signal processing section. This control information is shown as decoded RI and RQ phase control information, which may correspond to the $IP_i$ and $QP_i$ signals used to control the phase interpolators in the first embodiment. While the phase control information is preferably expressed in 32 bits, a different number of bits may be used.

The digital processing section includes a control loop which generates the phase control information. The control loop includes decoder 340, filter 350, and phase position accumulator 360. To generate the phase control information, the interpolated phases may initially be assumed to be at arbitrary positions. Sampler 330 then samples input data (illustratively shown in differential form) based on all four clock phase signals $RI^+$, $RI^-$, $RQ^+$, and $RQ^-$ output from the interpolator, and the sampling process produces four data samples DRI+/− and DRQ+/−.

The decoder performs an edge detection operation based on the samples to generate UP and DN signals. These signals are used to determine the position of phases $RI^+$, $RI^-$, $RQ^+$, and $RQ^-$ relative, for example, to an eye diagram. These phase positions, in turn, provide a basis for generating the phase control information that cause the phase interpolator to shift phases $RI^+$, $RI^-$, $RQ^+$, and $RQ^-$ to predetermined points on the eye.

The edge detection operation performed by the decoder involves locating an edge of the RI phase so that it may be positioned at a predetermined point on the eye diagram, e.g., at an eye crossing. As an example, consider the case where samples DRI+, DRQ+, DRI−, and DRQ− produce a digital value of 0011. The decoder may interpret these values as indicating that the edge (or eye crossing) of the data bit is between RQ+ and RI− clock phases. The decoder may interpret the digital value of 0110 as indicating an edge transition between RI+ and RQ+. In a case where the edge transition can definitely be determined, the decoder generates an UP signal to indicate that the RI phase has to happen earlier in order to coincide with the eye crossing (rotating RI/RQ clockwise with respect to I/Q on the phase diagram). The decoder generates a DN signal to indicate that the RI phase has to be delayed to pass the eye crossing (rotating RI/RQ counter clockwise with respect to I/Q on the phase diagram). Through an iterative process of decoding the sampled data, determining the position of RI, and then shifting RI phase output from the phase interpolator, the in-phase signal can be positioned to coincide with the eye crossing.

In the above example, it is noted that not all sample bit combinations contain valid information, e.g., a value of 0000 may indicate that the data did not switch or a value of 0100 may indicate jitter on the data signal. These samples may simply be ignored without activating either UP or DN. The logic of the decoder may be modified to generate UP and DN under these or other conditions. Additionally, the decoder may store preceding samples internally to improve edge detection for the RI phase.

Edge detection of the sampled data is thus performed so that the RI clock phase can be adjusted to coincide with a crossing point on the eye diagram. By performing edge detection, a determination can therefore be made as to which direction to shift the RI/RQ clock phases to perform data sampling. In the case of binary data, edge position can only be detected because the data switches are in one of two positions. Without an AD converter, the center or widest point of the eye diagram (or any other position) cannot be determined. Edge detection therefore can only be performed due to oversampling, which is used as a basis for adjusting the RI phase so that it is located at the crossing.

Ideally, the RI clock phase is adjusted so that it exactly coincides with the eye crossing. However, only valid data samples will allow a determination to be made as to whether that the edge of the sampled data is between two phases. For example, 01 or 10 of two sampled data values may represent an edge (e.g., 01 may represent a rising edge and 10 a falling edge), but the position of this edge may be in between two phases. Because of the binary nature of the sampled data, adjustments to the RI phase may therefor involve toggling back and forth across (e.g., in front of and behind) the crossing point in the eye. To achieve proper positioning of the RI phase (steady state), a large number of UP and DN signals may therefore be required.

The filter 350 is used to calculate an average of the UP and DN signals output from the decoder, and thus to provide a filtered number of UP and DN signals that is used to control the phase position accumulator. The filter may contain different filter stages and algorithms and be configured by additional control signals to allow a programmable filter characteristic.

In order to manually configure and control the position of the RI and RQ phases (e.g. during test or validation), the filter may include a multiplexer which selects external UP and DN signals generated, for example, by controller 390. Under normal operating conditions where the positions of the RI and RQ phases are automatically controlled, the multiplexer selects the filtered decoder output. The multiplexer thus provides an opening in the closed control loop. When the external UP and DN signals are selected, the RI/RQ clock phases are fixed in their position with respect to the I/Q phase. By reading the present phase position and drawing manual events of UP or DN through the external signals, the phase interpolator can be controlled to apply any predetermined programmable phase offset between I/Q and RI/RQ. Selecting the external UP/DN signals therefore allows the phase position to be manually tuned.

The accumulator 360 generates the phase control information that controls the shifts performed by the interpolator in the analog section. Initially, this is accomplished by generating an encoded RI phase position signal from the UP and DN signals output from the filter. This signal, which is a predetermined number of bits (e.g., 5 bits) in length, serves as a status signal for the controller 390 and enables reading of the current position of the RI and RQ phases relative to, for example, the eye diagram. (If the position of the RI phase is known, the RQ phase position can be determined because RI and RQ at this stage may be an orthogonal or otherwise known relationship). The RI and RQ phase control information is separately generated to enable the phases output from the interpolator to be independently shifted to predetermined points on the eye, e.g., crossing and ideal sampling points.

The controller generates an RQ offset signal based on the encoded RI phase signal. That is, once the position of the RI phase is known, the RQ phase can be easily determined. The RQ offset signal is then generated to effect an independent shift in the RQ phase relative to the RI phase, so that the RI and RQ phases are no longer in an orthogonal relationship and more specifically so that the RQ phase coincides with a predetermined point (e.g., ideal sampling point) on the eye diagram. The RQ offset may be two bits in length to allow the RQ phase to be shifted to four predetermined positions, shown, for example, in FIG. 8. If desired, the RQ offset signal may be expressed using more or less bits to define a corresponding number of predetermined increments. The RQ offset signal is therefore considered to be a static control signal which may be stored in an internal register bank of the controller.

To optimize performance, the controller preferably sets the RQ offset to a value which minimizes BER. This may be achieved by determining a current BER using, for example, a digital data analyzer for the sampled data (CLKO, DOUT). By determining the current BER, the RQ offset can be adjusted to position the RQ phase to coincide with a specific point (e.g., ideal sampling point) on the eye. Preferably, the BER is continuously monitored to provide dynamic RQ phase control. This will allow RQ offset to reflect changes in the BER and/or other conditions to thereby maintain the RQ phase at a predetermined eye point.

The accumulator generates RI phase control information based on the UP and DN signals output from the filter and generates the RQ phase control information based on the additional RQ offset signal. As a result, the control information output from the accumulator causes the interpolator to independently shift the RQ phase relative to the RI phase to a predetermined point on the eye. In order to shift the RQ phase to a point on the eye (or equivalently to a predetermined angle on the phase diagram), a 5-bit register may be used to store information designating the RI and RQ phase positions. An additional 2 bits may be used to specify the RQ offset position.

These bits are transformed by the accumulator into the 32-bit RI and RQ phase control information shown in FIG. 11, which may respectively correspond to $IP_i$ and $QP_i$ in FIG. 1. In this embodiment, the 32-bit information may be generated as 8 consecutive one values with the remaining bits set to zero. The placement of the ones and zeros in the 32-bit field determines the shift to be performed in the interpolator. For example, RI phase control information having a bit-field sequence of 00000000000011111111100000000000 would cause the interpolator to shift the RI phase by a certain amount, and a different placement of ones and zeros determined by the RQ offset would cause the interpolator to shift the RQ phase independently from the RI phase by an amount determined. The accumulator may store the bit-field information in a register dedicated to encoding the position of the lowest one value for each phase.

The accumulator may therefore operate as follows. When an UP or DN control signal is received from the filter, the RI phase position value stored in the register is incremented or decremented. If RI and RQ are at a 90-degree relation with one another, 32-bit RI and RQ phase control information can be generated from the value in the phase position register. The RQ phase control information can then be separately adjusted (e.g., incremented or decremented) based on the 2-bit RQ offset value to independently set the $RQ^+$ phase to coincide with the ideal sampling point on the eye diagram or any other point.

The eye diagram may be generated using any of the aforementioned techniques. Also, instead of generating the eye internally, an indication of the eye may be provided based on information generated by the sampler. For example, after the sample stage, the sampler may generate a one or zero and from this information the data may be recalculated to thereby form the eye. This is preferably performed by simple binary information. However, referencing FIG. 12 discussed in greater detail below, an AD converter can be used to provide more information and to perform the adjustment more accurately.

The phase interpolator adjusts the RI and RQ phase positions depending on the phase control information from the accumulator, i.e., the 32-bit decoded RI phase and RQ phase information ($IP_i$ and $QP_i$ in FIG. 1) which is respectively input into the phase interpolator. The phase interpolator preferably includes two phase interpolation circuits, each of which generates a respective one of in-phase and quadrature RI" and RQ" phase signals. That is, the decoded RI phase information is input into the in-phase (I) interpolator and the RQ phase information is input into the quadrature phase (Q) interpolator. The phase interpolation circuits may have a similar structure.

Figure 12:
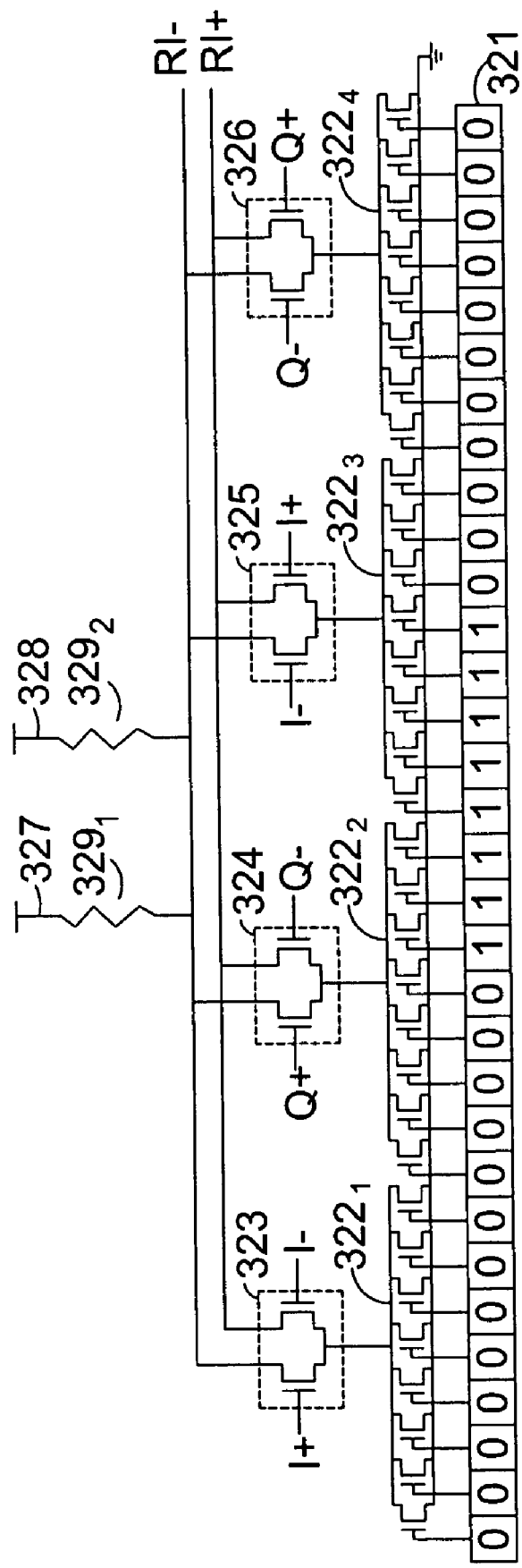
FIG. 12 is a diagram showing an RI phase interpolator which is one of two phase interpolators (the other being an RQ phase interpolator) included in the second embodiment of the recovery circuit.

FIG. 12 shows an example of the RI interpolator circuit. The interpolator includes a register 321 for storing a predetermined number of (e.g., 32) bits of phase control information output from the accumulator, multiple sets of transistors $322_1$-$322_4$ which represent current sources with equal strength that are controlled by corresponding bit values (e.g., 0 or 1) in the register, switching transistor pairs 323-326 defining current switches for controlling generation of the phase signals input into the data sampler, and two power supply lines 327 and 328. The interpolator circuits may have an identical structure such as shown in FIG. 12.

The 32-bit register stores the decoded RI phase control information output from the accumulator for shifting positions of the $RI^+$/$RI^-$ phases. The current switches in pair 323 respectively receive the I+ and I− clock signals output from the 4-phase clock generator as gate signals. The current switches in pair 324 respectively receive the Q+ and Q− clock signals output from the 4-phase clock generator as gate signals. The current switches in pair 325 respectively receive the I− and I+ clock signals output from the 4-phase clock generator as gate signals. And, the current switches in pair 326 respectively receive the Q+ and Q− clock signals output from the 4-phase clock generator as gate signals.

The main current flows from the power supply lines, through one of the current switches (or through both during transition), through the current source transistors, and into ground. While this implementation is based on CML logic, other types of logic may be used. Resistors $329_1$ and $329_2$ are load resistors. The current flowing through these resistors determines the voltage levels at the RI+ or RI− output, which can be interpreted as low and high signals.

Figure 13:
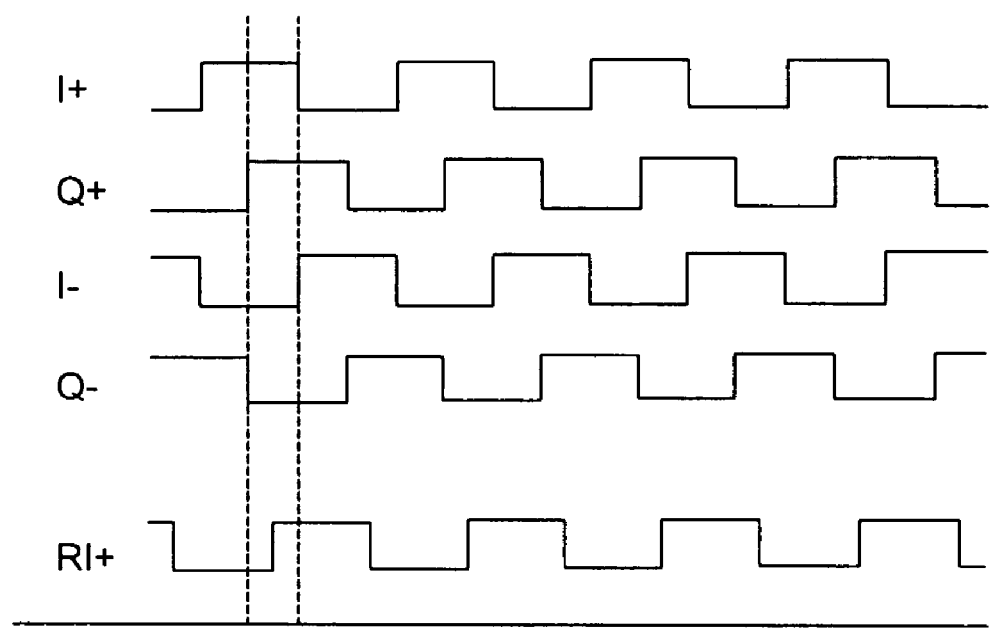
FIG. 13 is a diagram showing a timing diagram for the RI phase interpolator in FIG. 12.

Only current sources connected to a register set to a 1 value are relevant for the interpolation, as all other current rails are switched off. The circuitry thus behaves like a mixer. In this example, only the paths controlled by Q+/Q− and I−/I+ are relevant. As shown in the timing diagram of FIG. 13, during rising edge of Q+, RI+ starts the transition from zero to one. The full swing is not reached until the I− phase performs a rising edge. Depending on the position of the eight 1s, the crossing of the RI+ and RI− phases is more towards the Q+ or towards the I−. Thus, when switched, the current switches generate cumulative values based on the digital data stored in the register which define phase signals $RI^+$ and $RI^-$ used for controlling data sampling, e.g., to control generation of DRI+ and DRI− output from sampler 330. In this example, the RI clock phase position is 45 degrees between the Q+ and I− phase as shown in FIG. 13.

The phase interpolation circuit used for RQ+/RQ− generation is the same, but the input of the current switches are in the following order: Q+/Q−, I−/I+, Q−/Q+, I+/I−. In this exemplary embodiment, exactly eight consecutive bits of the total 32 bits in the register must be set to one to generate a properly interpolated phase. The size of the registers (32 bits in this case) may be varied to create different phase granularities. With 32 bits, however, a phase step resolution of 360°/32 can be generated.

If desired, the circuit may be designed so that the phase steps are not linear or exactly 360°/32. For example, thirty-two steps in one direction may correspond to exactly 360 degrees, but the spacing between the thirty-two phase steps may not be at equal distances from one another, e.g., some steps may be less than 360°/32 while others may be more than 360°/32 depending on the interpolation architecture.

The demultiplexer 370 demultiplexes the sampled $DQ^+$ and $DQ^-$ data signals and generates an 8-bit digital signal though its DOUT terminal. The demultiplexer also generates a phase-related clock signal CLK0 for input into digital logic for further processing of the recovered data. The $RI^+$ signal is input into the demultiplexer as a clock signal for selecting the sampled signals $DRQ^+$ and $DRQ^-$ for output to subsequent circuitry.

Figure 14:
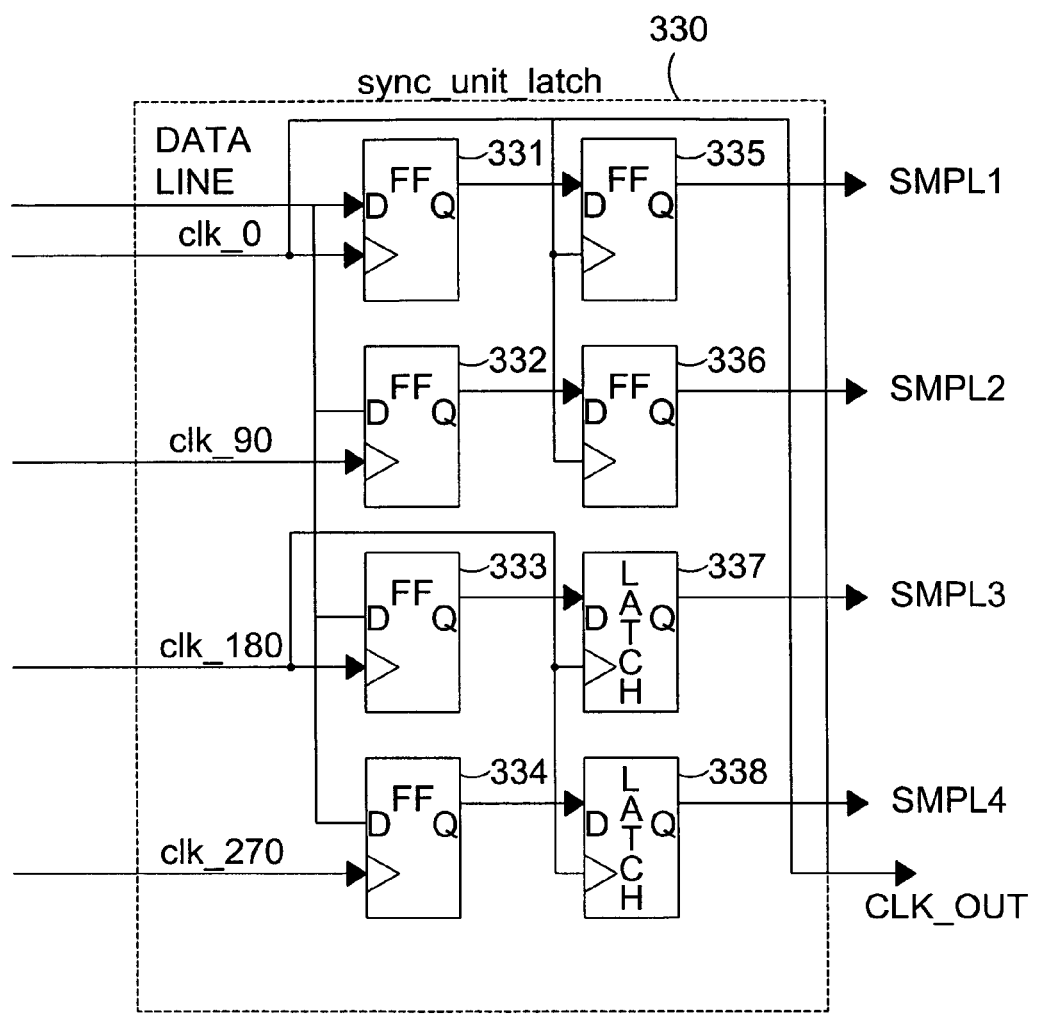
FIG. 14 is a diagram showing a data sampler included in the second embodiment of the recovery circuit.

FIG. 14 shows an example of how the data sampler may be configured. The sampler includes a first set of flip-flops 331-334, each of which includes a D input for receiving the data signal. Each flip-flop is controlled by a respective one of the clock phase signals RI" and RQ" output from the phase interpolators. In this example, clock phase signal $RI^+$ corresponds to CLK0, $RQ^+$ corresponds to CLK90, $RI^-$ corresponds to CLK180, and $RQ^-$ corresponds to CLK270. The Q outputs of flip-flops 331 and 332 are connected to the D input of flip-flops 335 and 336 respectively, and the Q outputs of flip-flops 333 and 334 are connected to the inputs of latches 337 and 338 respectively. These latter flip-flops have their clock terminals connected to the $RI^+$ (CLK0) phase signal, and the latches are based on a D flip-flop design with the clock terminals connected to the $RI^-$ (CLK180) phase signal. The second row containing flip-flops 335 and 336 and the latches are included in the sampler to synchronize all signals to one clock domain CLK_OUT which is effectively the RI+ clock phase. The flip-flops and latches may be constructed using differential logic to match the input data shown in FIG. 11.

When the $RI^+$ (CLK0) phase signal goes high, flip-flop 331 samples the data and stores the resulting value in its Q output. When the $RQ^+$ (CLK90) phase signal goes high, flip-flop 332 samples the data and stores the resulting value in its Q output. When the $RI^-$ (CLK180) phase signal goes high, flip-flop 333 samples the data and stores the resulting value in its Q output. And, when the $RQ^-$ (CLK270) phase signal goes high, flip-flop 334 samples the data and stores the resulting value in its Q output.

The sampled data is output from the sampler based on the $RI^+$ (CLK0) and $RI^-$ (CLK180) phase signals. Upon the next rising edge transition of CLK0, flip-flops 335 and 336 simultaneously output the sampled values SMPL1 and SMPL2 stored in the Q outputs of flip-flops 331 and 332. Sampled data SMPL1 and SMPL2 correspond to the $RI^+$ sample $DRI^+$ and the $RQ^+$ sample $DRQ^+$ respectively. Upon the next rising edge of CLK180, latches 337 and 338 simultaneously output the sample values SMPL3 and SMPL4 st stored in the Q outputs of flip-flops 333 and 334. Sampled data SMPL3 and SMPL4 correspond to the $RI^-$ sample $DRI^-$ and the $RQ^-$ sample $DRQ^-$ respectively.

In the foregoing process, the data sampled based on the RI phase signals is used by the control loop as a basis for determining the edge position, and more specifically to adjust the RI and RQ phase. Of course, for the final data sampling the RI phase and RI data samples are not used. In other applications, the reference clock can be replaced by a clock recovery circuitry to create the initial I and Q phases.

The second embodiment thus sets the RI and RQ phase positions to coincide with predetermined points on an eye diagram generated for a received data signal. The RI phase may be set to coincide with an eye crossing and the RQ phase may be set to coincide with an ideal sampling point. While these positions are advantageous, other points on the eye diagram may also be selected. By separately adjusting the configuration values of the phase interpolators (e.g., RI and RQ phase control signals), the RQ phase position can independently be controlled to coincide with the widest point on the eye where data sampling is considered to be ideal. If desired, the RQ phase signal can be set at the eye crossing and RI at the ideal sampling point The reference-clock embodiment is preferable when multiple data lines are to be sampled. In this case, only one external clock is required in order to build the circuitry; that is, the reference clock is generated once and the data sampling/recovery circuitry is implemented for as many lines as there exists in the system. Overhead for additional reference clock pins is therefore not substantially increased.

Figure 15:
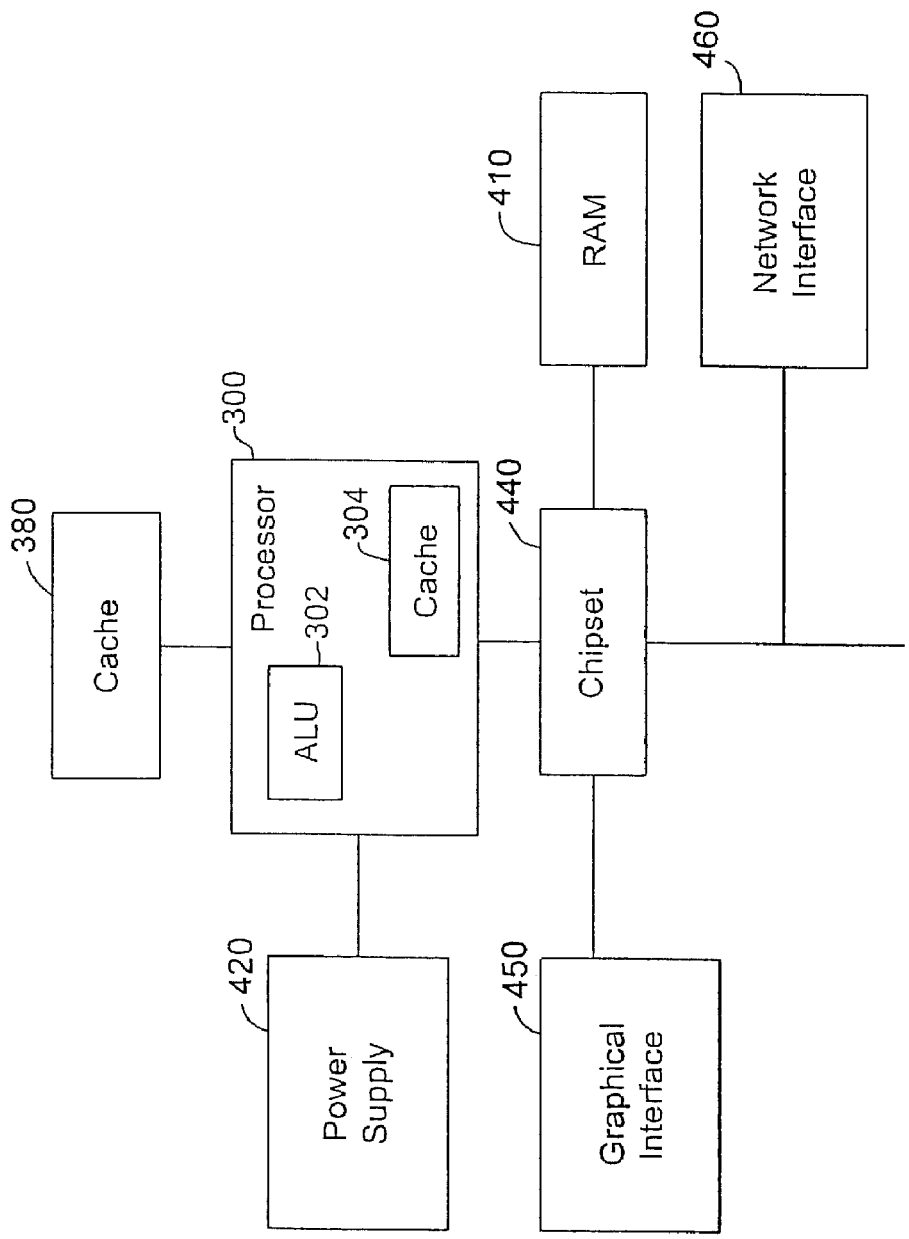
FIG. 15 is a diagram showing a processing system which includes one or more embodiments of the phase interpolators and/or clock recovery circuit.

FIG. 15 shows a system which includes a processor 300 and a memory 410. The processor may include an internal arithmetic logic unit 302 and cache 304, and the memory may be a random access memory or any other type of memory capable of storing data generated, processed, or otherwise controlled by or transferred through the processor. The processor and preferably the memory receive power from supply 420. The system may also include an external memory (e.g., cache) 380, a chipset 440, a graphical interface 450, and a network interface 460. These features are considered to be optional in the system.

Any one or more of the blocks in FIG. 15 may be incorporated onto a single chip die. When implemented in this manner, a recovery circuit in accordance with any of the previously described embodiments may be incorporated into any one of the blocks in FIG. 15, with the possible exception of the power supply, to control sampling of data or other management functions for inter-chip communication or inter-module communication.

Any reference in this specification to an "embodiment" means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Furthermore, for ease of understanding, certain functional blocks may have been delineated as separate blocks; however, these separately delineated blocks should not necessarily be construed as being in the order in which they are discussed or otherwise presented herein. For example, some blocks may be able to be performed in an alternative ordering, simultaneously, etc.

Although the present invention has been described herein with reference to a number of illustrative embodiments, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A system, comprising:
    a first interpolator to adjust a phase of an in-phase signal; and
    a second interpolator to adjust a phase of a quadrature signal,
    wherein the second interpolator is to adjust the quadrature signal phase independently from the phase adjustment of the in-phase signal performed by the first interpolator, the first interpolator to adjust the phase of the in-phase signal to coincide with a first predetermined point on an eye diagram, and the second interpolator to adjust the phase of the quadrature signal to coincide with a second predetermined point on an eye diagram,
    wherein at least one of the phase of the in-phase signal or the phase of the quadrature signal is to be adjusted so that the phase of the in-phase signal at the first predetermined point is non-orthogonal to the phase of the quadrature signal at the second predetermined point on the eye diagram.

2. The system of claim 1, wherein the second interpolator adjusts the quadrature signal phase based on one or more predetermined increments.

3. The system of claim 1, wherein the second predetermined point is a widest point on the eye diagram.

4. The system of claim 1, further comprising:
    a controller which sets at least one configuration value of the second phase interpolator, wherein the second phase interpolator adjusts the quadrature signal phase independently from the phase of the in-phase signal based on said at least one configuration value.

5. The system of claim 4, wherein said at least one configuration value includes an offset value for the quadrature signal phase.

6. The system of claim 1, wherein the second interpolator adjusts the phase of the quadrature signal to the second predetermined point by one or more predetermined phase increments.

7. The system of claim 6, wherein a difference between the phase of the in-phase signal at the first predetermined point and the phase of the quadrature signal at the second predetermined point corresponds to said one or more predetermined phase increments.

8. The system of claim 6, further comprising:
    sampling the in-phase and quadrature phase signals based on the independently adjusted phases of the in-phase and quadrature signals.

9. A system, comprising:
    a demodulator to generate in-phase and quadrature signals from a data signal; and
    a phase adjuster to adjust a phase of the quadrature signal independently from a phase of the in-phase clock signal, wherein the adjusted phase of the quadrature signal corresponds to a clock signal, wherein a non-orthogonal relationship exists between the phases of the quadrature and in-phase signals after said adjustment, the adjusted phases of the in-phase and quadrature signals corresponding to non-orthogonal positions on an eye diagram.

10. The system of claim 9, wherein the phase adjuster adjusts the quadrature signal phase based on one or more predetermined increments.

11. The system of claim 9, further comprising:
    a sampler which samples the data signal based on said clock signal.

12. A method, comprising:
    generating in-phase and quadrature signals from a data signal; and
    adjusting a phase of the quadrature signal independently from a phase of the in-phase signal, wherein said adjusting includes:
    adjusting the phase of the in-phase signal to coincide with a first point on the eye diagram and adjusting the phase of the quadrature signal to coincide with a second point on the eye diagram, wherein at least one of the phase of the in-phase signal or the phase of the quadrature signal is adjusted so that the phase of the in-phase signal at the first point is non-orthogonal to the phase of the quadrature signal at the second point on the eye diagram.

13. The method of claim 12, wherein the second point is a widest point on the eye diagram.

14. The method of claim 12, wherein the second point is a widest point and the first point is a crossing point in the eye diagram.

15. The method of claim 12, wherein adjusting the quadrature signal phase includes:
    mapping a phase of the quadrature signal onto an eye diagram of the data signal;
    determining a difference between the phase of the quadrature signal and a phase which coincides with a first point on the eye diagram; and
    adjusting the quadrature signal phase to reduce said difference.

16. The method of claim 15, wherein the quadrature signal phase is adjusted to at least substantially eliminate said difference.

17. The method of claim 15, wherein the quadrature signal phase is adjusted in one or more predetermined increments to reduce said difference.

18. The method of claim 15, wherein the first point is a widest point on the eye diagram.

19. The method of claim 15, wherein adjusting the quadrature signal phase to reduce said difference does not change the phase of the in-phase signal.

20. The method of claim 12, further comprising:
    sampling the data signal based on the adjusted quadrature signal phase.

21. A system, comprising:
    a first circuit; and
    a second circuit which includes:
    (a) a demodulator to generate in-phase and quadrature signals from a data signal; and
    (b) a phase adjuster to adjust a phase of the quadrature signal independently from a phase of the in-phase clock signal, wherein the adjusted phase of the quadrature signal corresponds to a clock signal used to control the first circuit, wherein a non-orthogonal relationship exists between the phases of the quadrature and in-phase signals after said adjustment, the adjusted phases of the in-phase and quadrature signals corresponding to non-orthogonal positions on an eye diagram.

22. The system of claim 21, wherein the phase adjuster adjusts the quadrature signal phase based on one or more predetermined increments.

23. The system of claim 21, wherein the first circuit is at least one of a processor and a memory.

24. The system of claim 21, wherein the first circuit and second circuit are included on a same chip die.

* * * * *